(12) United States Patent
Shibata

(10) Patent No.: US 11,957,054 B2
(45) Date of Patent: Apr. 9, 2024

(54) THERMOELECTRIC GENERATOR

(71) Applicant: KELK Ltd., Kanagawa (JP)

(72) Inventor: Isao Shibata, Kanagawa (JP)

(73) Assignee: KELK Ltd., Kanagawa (JP)

( * ) Notice: Subject to any disclaimer, the term of this patent is extended or adjusted under 35 U.S.C. 154(b) by 0 days.

(21) Appl. No.: 17/640,233

(22) PCT Filed: Sep. 16, 2020

(86) PCT No.: PCT/JP2020/035094
§ 371 (c)(1),
(2) Date: Mar. 3, 2022

(87) PCT Pub. No.: WO2021/065514
PCT Pub. Date: Apr. 8, 2021

(65) Prior Publication Data
US 2022/0320411 A1 Oct. 6, 2022

(30) Foreign Application Priority Data

Oct. 1, 2019 (JP) .................... 2019-181598

(51) Int. Cl.
*H10N 10/17* (2023.01)
*H10N 10/01* (2023.01)

(52) U.S. Cl.
CPC ............ *H10N 10/17* (2023.02); *H10N 10/01* (2023.02)

(58) Field of Classification Search
CPC .. H01L 35/02–34; H01N 10/17; H01N 10/01; H04W 52/0277; G06F 1/3203
See application file for complete search history.

(56) References Cited

U.S. PATENT DOCUMENTS

2012/0165963 A1* 6/2012 Kim .................. G06F 1/266
700/22

FOREIGN PATENT DOCUMENTS

| JP | 06-022572 | 1/1994 |
|---|---|---|
| JP | 2007-159310 | 6/2007 |
| JP | 2018-190053 | 11/2018 |
| JP | 2018190053 A | * 11/2018 |
| JP | 2019-089423 | 6/2019 |
| JP | 2019-105975 | 6/2019 |

OTHER PUBLICATIONS

JP 2018190053 A, Hoang, Machine Translation (Year: 2018).*
International Search Report in International Appln. No. PCT/JP2020/035094, dated Nov. 10, 2020, 2 pages.

* cited by examiner

*Primary Examiner* — Devina Pillay
(74) *Attorney, Agent, or Firm* — Fish & Richardson P.C.

(57) ABSTRACT

A thermoelectric generator includes a thermoelectric generation module, a power storage unit configured to store electric charge generated from the thermoelectric generation module, a switching unit configured to switch between supply and stop of discharge to a transceiver (transmission/reception unit) driven by discharge from the power storage unit, and a determination unit configured to determine stop of discharge from the power storage unit, in which the determination unit determines stop of discharge before completion of discharge from the power storage unit.

11 Claims, 4 Drawing Sheets

THERMOELECTRIC GENERATOR

CROSS-REFERENCE TO RELATED APPLICATIONS

This application is a National Stage application of International Application No. PCT/JP2020/035094, filed on Sep. 16, 2020, which claims priority to Japanese Patent Application No. 2019-181598, filed on Oct. 1, 2019. The contents of the prior applications are incorporated herein in their entirety.

FIELD

The present invention relates to a thermoelectric generator.

BACKGROUND

A technique for supplying electric power from a thermoelectric generator employing a thermoelectric element to a load is known (see, for example, Patent Literature 1). The technique disclosed in Patent Literature 1 supplies stable electric power to a load requiring large electric power while extracting maximum electric power from the thermoelectric generator. Therefore, in the technique disclosed in Patent Literature 1, in consideration of the load resistance, the discharge cycle of a capacitor is intermittently switched using a switch such that the charging voltage of the capacitor becomes ½ of the voltage generated by a thermoelectric generating equipment.

CITATION LIST

Patent Literature

Patent Literature 1: JP 2007-159310 A

SUMMARY

Technical Problem

A thermoelectric generator discharges electricity from a power storage unit regardless of an operating state of a controller. Therefore, there is a possibility that the discharge is continued even after the completion of operation of the controller, resulting in waste of electric power.

An object of an aspect of the present invention is to improve the operation frequency.

Solution to Problem

According to an aspect of the present invention, a thermoelectric generator comprises: a thermoelectric generation module; a power storage unit configured to store electric charge generated from the thermoelectric generation module; a switching unit configured to switch between supply and stop of discharge to a transmission/reception unit driven by discharge from the power storage unit; and a determination unit configured to determine stop of discharge from the power storage unit, wherein the determination unit determines stop of discharge before completion of discharge from the power storage unit.

Advantageous Effects of Invention

According to an aspect of the present invention, the operation frequency can be improved.

DESCRIPTION OF EMBODIMENTS

Embodiments of the present invention will be described below with reference to the drawings, but the present invention is not limited thereto. Components of the embodiments described below can be appropriately combined. In addition, some components may not be used.

First Embodiment

<Thermoelectric Generator>

Figure 1:
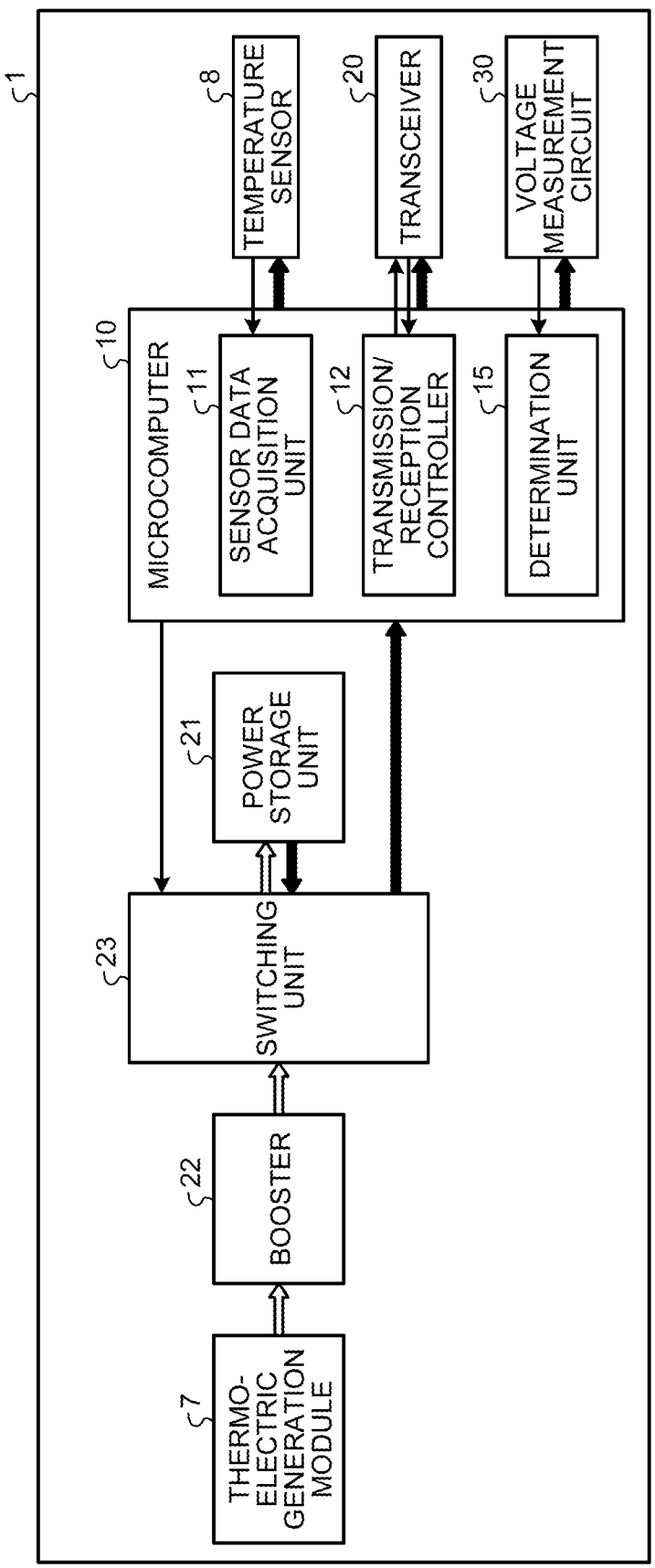
FIG. 1 is a block diagram illustrating a thermoelectric generator according to a first embodiment.
Figure 2:
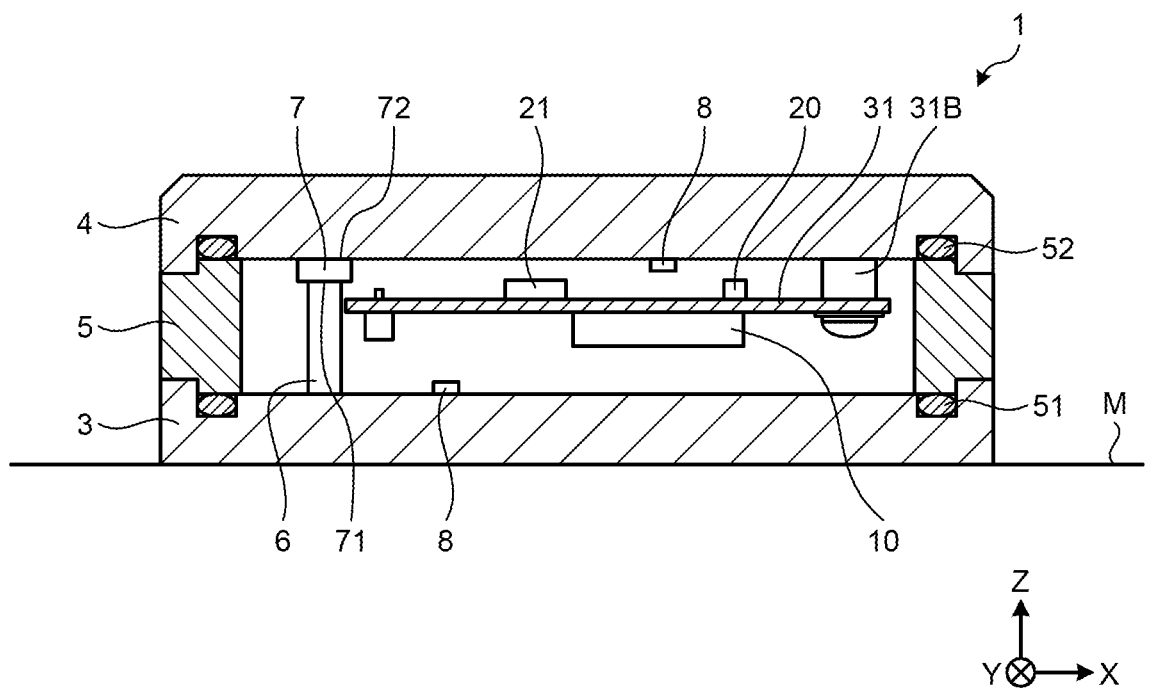
FIG. 2 is a cross-sectional view of the thermoelectric generator according to the first embodiment.

FIG. 1 is a block diagram illustrating a thermoelectric generator 1 according to a first embodiment. FIG. 2 is a cross-sectional view of the thermoelectric generator 1 according to the first embodiment. The thermoelectric generator 1 is installed on, for example, an apparatus M disposed in a construction machine or a factory facility. The apparatus M is, for example, an apparatus that generates heat during operation, including a motor or a gear. The thermoelectric generator 1 detects a temperature of the apparatus M and transmits a signal indicating the detected temperature to an external apparatus by a radio wave. The apparatus M functions as a heat source of the thermoelectric generator 1.

The thermoelectric generator 1 includes a heat receiving plate 3, a heat sink 4, a wall portion 5, a heat-transfer member 6, a thermoelectric generation module (power generation unit) 7, temperature sensors 8, a microcomputer 10, a power storage unit 21, a booster 22, a switching unit 23, a transceiver (transmission/reception unit) 20, a voltage measurement circuit 30, and a board 31. Specific examples of the power storage unit 21 include a capacitor and a secondary battery. In FIG. 1, thick white arrows indicate current flows during charging, and thick black arrows indicate current flows during discharging.

The heat receiving plate 3 is installed in the apparatus M. The heat receiving plate 3 is a plate-shaped member. The heat receiving plate 3 is formed of, for example, a metal material containing aluminum or copper. The heat receiving plate 3 receives heat from the apparatus M. The heat from the heat receiving plate 3 is conducted to the thermoelectric generation module 7 through the heat-transfer member 6.

The heat sink 4 faces the heat receiving plate 3 in the Z-axis direction and is disposed apart from the heat receiving plate 3. The heat sink 4 is a plate-shaped member. The heat sink 4 is formed of, for example, a metal material containing aluminum or copper. The heat sink 4 receives heat from the thermoelectric generation module 7. The heat from the heat sink 4 is radiated to an atmospheric space around the thermoelectric generator 1.

The wall portion 5 has a rectangular tubular shape as viewed in the Z-axis direction. The wall portion 5 is disposed to surround the heat receiving plate 3 and the heat sink 4. The wall portion 5, the heat receiving plate 3, and the heat sink 4 form a box shape having a space therein. The wall portion 5 is formed of a synthetic resin material having heat insulation properties and radio-wave transparency.

A sealing member 51 is installed at a joint between the peripheral edge portion of the heat receiving plate 3 and the −Z-side end portion of the wall portion 5. A sealing member 52 is installed at a joint between the peripheral edge portion of the heat sink 4 and the +Z-side end portion of the wall portion 5. The sealing member 51 and the sealing member 52 include, for example, an O-ring. The sealing member 51 and the sealing member 52 seal the thermoelectric generator 1. This structure restricts entry of foreign matter into the thermoelectric generator 1.

The heat-transfer member 6 is erected from the heat receiving plate 3 toward the +Z side. The heat-transfer member 6 connects the heat receiving plate 3 and the thermoelectric generation module 7. The heat-transfer member 6 conducts heat from the heat receiving plate 3 to the thermoelectric generation module 7. The heat-transfer member 6 is formed of, for example, a metal material containing aluminum or copper. The heat-transfer member 6 has a columnar shape elongated in the Z-axis direction.

The thermoelectric generation module 7 generates electric power using the Seebeck effect. The thermoelectric generation module 7 is installed on the heat sink 4. When a −Z-side end surface 71 of the thermoelectric generation module 7 is heated by the heat source, a temperature difference is generated between the −Z-side end surface 71 and a +Z-side end surface 72 of the thermoelectric generation module 7. The thermoelectric generation module 7 generates electric power by a temperature difference generated between the end surface 71 and the end surface 72. The thermoelectric generation module 7 may be installed on the heat receiving plate 3.

The temperature sensors 8 are respectively installed on the heat receiving plate 3 and the heat sink 4. The temperature sensor 8 installed on the heat receiving plate 3 detects the temperature of the heat receiving plate 3 that has received heat from the apparatus M. The temperature sensor 8 installed on the heat sink 4 detects the temperature of the heat sink 4. The temperature sensors 8 are driven by electric power generated by the thermoelectric generation module 7. The temperature sensors 8 are driven by discharge from the power storage unit 21.

The power storage unit 21 stores electric charge generated from the thermoelectric generation module 7. When the stored electric power exceeds a predetermined voltage VC, the power storage unit 21 drives the temperature sensors 8, the microcomputer 10, and the transceiver 20.

The booster 22 boosts and outputs the input electric power. More specifically, during charging of the power storage unit 21, the booster 22 boosts electric power generated in the thermoelectric generation module 7 and outputs the boosted electric power to the power storage unit 21. During discharging from the power storage unit 21, electric power discharged from the power storage unit 21 is output to the microcomputer 10. In the present embodiment, the booster 22 is disposed between the thermoelectric generation module 7 and the power storage unit 21 on an electric circuit.

The switching unit 23 switches between supply and stop of discharge to the temperature sensors 8, the microcomputer 10, and the transceiver 20, which are driven by discharge from the power storage unit 21. In the present embodiment, the switching unit 23 is disposed between the booster 22 and the power storage unit 21 and between the power storage unit 21 and the microcomputer 10 on the electric circuit.

The transceiver 20 wirelessly transmits a transmission signal based on detection data of the temperature sensors 8. The transceiver 20 is driven by electric power generated by the thermoelectric generation module 7. The transceiver 20 is driven by discharge from the power storage unit 21. More specifically, every time the electric power stored in the power storage unit 21 exceeds the predetermined voltage VC, the transceiver 20 transmits a transmission signal based on the detection data to a management computer. The transceiver 20 is installed on the board 31.

The transceiver 20 transmits a transmission signal based on the detection data of the temperature sensors 8 to the management computer (not illustrated) under the control of a transmission/reception controller 12 of the microcomputer 10.

The voltage measurement circuit 30 is a circuit that measures the voltage of the power storage unit 21. The voltage measured by the voltage measurement circuit 30 is output to the microcomputer 10.

The board 31 includes a control board. The board 31 is disposed between the heat receiving plate 3 and the heat sink 4. The board 31 is connected to the heat sink 4 via a support member 31B.

<Microcomputer>

Returning to FIG. 1, the microcomputer 10 controls the thermoelectric generator 1. The microcomputer 10 is driven by electric power generated by the thermoelectric generation module 7. The microcomputer 10 is driven by discharge from the power storage unit 21. More specifically, the microcomputer 10 is driven every time the electric power stored in the power storage unit 21 exceeds the predetermined voltage VC. The microcomputer 10 includes a sensor data acquisition unit 11, the transmission/reception controller 12, and a determination unit 15. The microcomputer 10 is installed on the board 31.

The sensor data acquisition unit 11 acquires the detection data of the temperature sensors 8. The detection data of the temperature sensors 8 acquired by the sensor data acquisition unit 11 is transmitted to the management computer via the transceiver 20 by the transmission/reception controller 12.

The transmission/reception controller 12 controls transmission/reception of data to/from the management computer by the transceiver 20. The transmission/reception controller 12 can detect that transmission/reception of data to/from the management computer is completed.

The determination unit 15 determines stop of discharge from the power storage unit 21. The determination unit 15 determines stop of discharge before completion of discharge from the power storage unit 21. In the present embodiment, the determination unit 15 determines stop of discharge when the transmission via the transceiver 20 by the transmission/reception controller 12 is completed. More specifically, the determination unit 15 determines stop of discharge when the process (hereinafter referred to as a "transmission process") of transmitting the detection data of the temperature sensors 8 acquired by the sensor data acquisition unit 11 to the management computer via the transceiver 20 by the transmission/reception controller 12 is completed.

Figure 3:
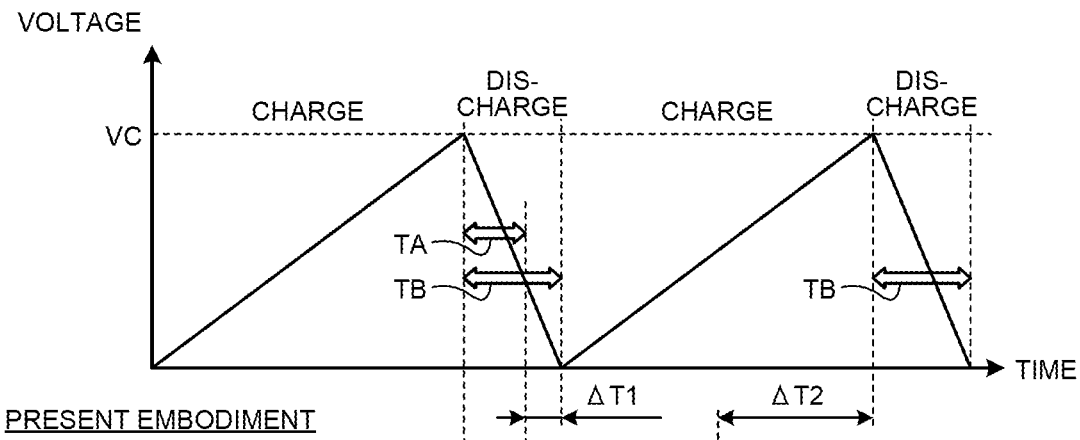
FIG. 3 is a diagram for explaining operation frequencies of a conventional thermoelectric generator and the thermoelectric generator according to the first embodiment.

FIG. 3 is a diagram for explaining operation frequencies of a conventional thermoelectric generator and the thermoelectric generator 1 according to the first embodiment. In the present embodiment, when the power storage unit 21 is charged to the predetermined voltage VC, discharging from the power storage unit 21 to the microcomputer 10 is started. The microcomputer 10 is driven by electric power supplied from the power storage unit 21, and the temperature sensors 8 and the transceiver 20 are further driven. The voltage of the power storage unit 21 drops from the predetermined voltage VC due to the discharge. The voltage of the power storage unit 21 when the transmission process in the microcomputer 10 is completed is VE (>0).

<Operation of Thermoelectric Generator>

An example of an operation of the thermoelectric generator 1 configured as described above will be described. When the apparatus M is driven, the apparatus M generates heat. The heat from the apparatus M is conducted to the thermoelectric generation module 7 through the heat receiving plate 3 and the heat-transfer member 6. The thermoelectric generation module 7 that has received the heat generates the power using the temperature difference generated between the end surface 71 and the end surface 72. The electric power generated by the thermoelectric generation module 7 charges the power storage unit 21. Every time the electric power stored in the power storage unit 21 exceeds the predetermined voltage VC, the power storage unit 21 is discharged, and the temperature sensors 8, the microcomputer 10, and the transceiver 20 are driven.

<Process in Microcomputer>

Figure 4:
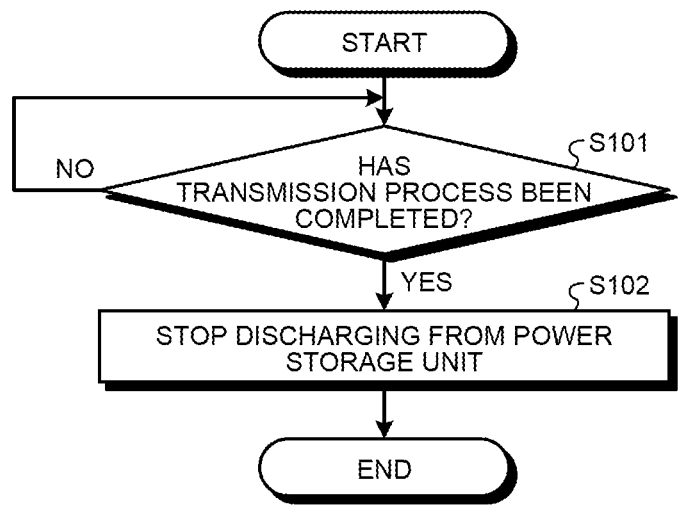
FIG. 4 is a flowchart illustrating an example of the process in a microcomputer of the thermoelectric generator according to the first embodiment.

Next, an example of the process in the microcomputer 10 will be described with reference to FIG. 4. FIG. 4 is a flowchart illustrating an example of the process in the microcomputer 10 of the thermoelectric generator 1 according to the first embodiment. When electric power is supplied from the power storage unit 21, the microcomputer 10 is driven. In the microcomputer 10, the process of transmitting the detection data of the temperature sensors 8 acquired by the sensor data acquisition unit 11 to the management computer via the transceiver 20 by the transmission/reception controller 12 is performed. Furthermore, the microcomputer 10 executes the processes illustrated in the flowchart in FIG. 4.

In the microcomputer 10, the determination unit 15 determines whether the transmission/reception controller 12 has completed the process of transmitting the detection data of the temperature sensors 8 acquired by the sensor data acquisition unit 11 to the management computer via the transceiver 20 (Step S101). When the determination unit 15 determines that the transmission process has been completed (Yes in Step S101), the process proceeds to Step S102. When the determination unit 15 does not determine that the transmission process has been completed (No in Step S101), the process in Step S101 is executed again.

When determining that the transmission process has been completed (Yes in Step S101), the microcomputer 10 causes the switching unit 23 to stop discharging from the power storage unit 21 (Step S102). The microcomputer 10 ends the process.

When discharging from the power storage unit 21 is stopped in Step S102, charging of the power storage unit 21 is started. Then, when the electric power stored in the power storage unit 21 exceeds the predetermined voltage VC, the power storage unit 21 is discharged, and the processing of the flowchart in FIG. 4 is executed.

<Effects>

As described above, in the present embodiment, stop of discharge from the power storage unit 21 is determined before completion of discharge from the power storage unit 21. In the present embodiment, when it is determined that the process in which the transmission/reception controller 12 transmits the detection data of the temperature sensors 8 acquired by the sensor data acquisition unit 11 to the management computer via the transceiver 20 has been completed, stop of discharge from the power storage unit 21 is determined. In the present embodiment, since the voltage VE of the power storage unit 21 when the discharge from the power storage unit 21 is stopped is not zero, the time required to charge the power storage unit 21 to the predetermined voltage VC is shortened. According to the present embodiment, the transmission interval of the detection data can be shortened. As described above, the present embodiment can improve the operation frequency that is the transmission frequency of the transmission process.

In the present embodiment, stop of discharge from the power storage unit 21 is determined before completion of discharge from the power storage unit 21. As a result, in the present embodiment, even when the storage capacity of the power storage unit 21 is larger than the storage capacity required for one transmission process, the time required to charge the power storage unit 21 to the predetermined voltage VC can be shortened. According to the present embodiment, the operation frequency can be improved.

On the other hand, as illustrated in FIG. 3, the conventional thermoelectric generator discharges electricity from a power storage unit until the voltage of the power storage unit becomes zero regardless of the operating state of the microcomputer. Therefore, even after the operation of the microcomputer is completed, discharging from the power storage unit is continued, and electric power is wasted. The discharge time in this case is defined as TB. The discharge time TB is longer than a discharge time TA of the present embodiment by a time $\Delta t1$. In addition, when the power storage unit is charged, since the power storage unit is charged from a voltage of zero to the predetermined voltage VC, the charge time becomes long. Accordingly, in FIG. 3, a difference in time until the second transmission process is performed is $\Delta t2$ between the conventional thermoelectric generator and the thermoelectric generator 1 of the present embodiment.

Second Embodiment

Figure 5:
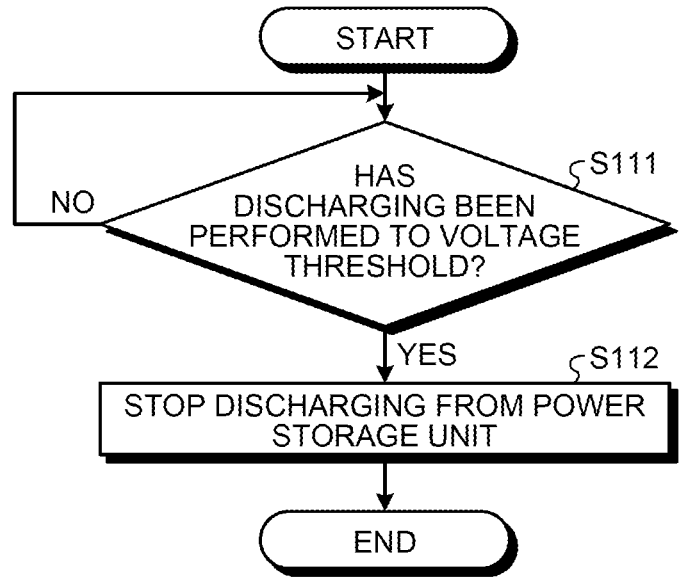
FIG. 5 is a flowchart illustrating an example of the process in the microcomputer of the thermoelectric generator according to a second embodiment.

FIG. 5 is a flowchart illustrating an example of the process in the microcomputer 10 of the thermoelectric generator 1 according to a second embodiment. In the following description, the same or equivalent components as those of the above-described embodiment are denoted by the same reference numerals, and the description thereof is simplified or omitted. The second embodiment is different from the first embodiment in the process in the determination unit 15 of the microcomputer 10. Electric power required for the microcomputer 10 to perform one transmission process is constant.

The determination unit 15 determines stop of discharge when the voltage of the power storage unit 21 is equal to or less than a voltage threshold on the basis of the voltage of the power storage unit 21 measured by the voltage measurement circuit 30.

The voltage threshold is a value indicating electric power required for the microcomputer 10 to perform one transmission process. The voltage threshold is about equal to the voltage VE of the power storage unit 21 when the transmission process is completed in the microcomputer 10, and is a value equal to or less than the voltage VE.

<Process in Microcomputer>

Next, an example of the process in the microcomputer 10 will be described with reference to FIG. 5. In Step S112, a process similar to that in Step S102 of the flowchart illustrated in FIG. 4 is performed.

The microcomputer 10 causes the determination unit 15 to determine whether discharging has been performed until the voltage of the power storage unit 21 measured by the voltage measurement circuit 30 becomes equal to or lower than the voltage threshold, in other words, whether the voltage of the power storage unit 21 is equal to or lower than the voltage threshold (Step S111). When the determination unit 15 determines that the voltage of the power storage unit 21 is equal to or lower than the voltage threshold (Yes in Step S111), the process proceeds to Step S112. When the determination unit 15 does not determine that the voltage of the power storage unit 21 is equal to or lower than the voltage threshold (No in Step S111), the process in Step S111 is executed again.

<Effects>

As described above, in the present embodiment, when the voltage of the power storage unit 21 is equal to or lower than the voltage threshold, which is a value equal to or lower than the voltage VE, stop of discharge from the power storage unit 21 is determined. According to the present embodiment, the operation frequency can be improved.

Third Embodiment

Figure 6:
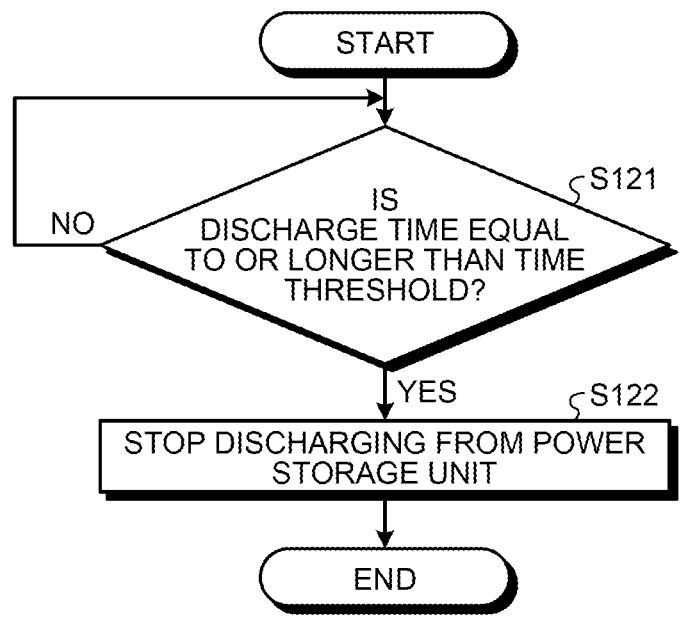
FIG. 6 is a flowchart illustrating an example of the process in the microcomputer of the thermoelectric generator according to a third embodiment.

FIG. 6 is a flowchart illustrating an example of the process in the microcomputer 10 of the thermoelectric generator 1 according to a third embodiment. In the following description, the same or equivalent components as those of the above-described embodiment are denoted by the same reference numerals, and the description thereof is simplified or omitted. The third embodiment is different from the first embodiment in the process in the determination unit 15 of the microcomputer 10. The time required for the microcomputer 10 to perform one transmission process is constant.

The determination unit 15 determines stop of discharge when the discharge time elapsed from the start of the discharge by the power storage unit 21 is equal to or longer than a time threshold. The discharge time is measured by a clock built in the microcomputer 10.

The time threshold is a value indicating the time required for the microcomputer 10 to perform one transmission process. The time threshold is about equal to the time TA until the transmission process is completed in the microcomputer 10, and is a value equal to or more than the time TA.

<Process in Microcomputer>

Next, an example of the process in the microcomputer 10 will be described with reference to FIG. 6. In Step S122, a process similar to that in Step S102 of the flowchart illustrated in FIG. 4 is performed.

The microcomputer 10 causes the determination unit 15 to determine whether a discharge time that has elapsed since the power storage unit 21 started discharging is equal to or longer than the time threshold (Step S121). When the determination unit 15 determines that the discharge time elapsed since the power storage unit 21 started discharging is equal to or longer than the time threshold (Yes in Step S121), the process proceeds to Step S122. When the determination unit 15 does not determine that the discharge time that has elapsed since the power storage unit 21 started discharging is equal to or longer than the time threshold (No in Step S121), the process in Step S121 is executed again.

<Effects>

As described above, in the present embodiment, when the discharge time elapsed from the start of discharge by the power storage unit 21 is equal to or longer than the time threshold, stop of discharge from the power storage unit 21 is determined. According to the present embodiment, the operation frequency can be improved.

MODIFICATION

Although the examples in which the transmission signal based on the detection data of the temperature sensors 8 is transmitted to the management computer (not illustrated) have been described above, applications to a vibration sensor, an optical sensor, and an odor sensor other than the temperature sensors 8 are also possible.

The invention claimed is:

1. A thermoelectric generator comprising:
   a thermoelectric generation module;
   a power storage configured to store electric charge generated from the thermoelectric generation module;
   a transceiver configured to operate based on receiving the electric charge from the power storage, the transceiver being configured to transmit a transmission signal based on a voltage of the power storage exceeding a predetermined voltage;
   a switching electric circuit configured to switch between supply and stop of a discharge of the electric charge from the power storage to the transceiver, the switching electric circuit being configured to start the discharge of the electric charge from the power storage to the transceiver based on the power storage being charged to the predetermined voltage; and
   a microcomputer configured to control the switching electric circuit to stop the discharge of the electric charge from the power storage to the transceiver,
   wherein the microcomputer is configured to control the switching electric circuit to stop the discharge of the electric charge from the power storage to the transceiver before the power storage is exhausted to thereby charge the power storage to the predetermined voltage.

2. The thermoelectric generator according to claim 1, wherein the microcomputer comprises a transmission/reception controller configured to control transmission/reception by the transceiver,
   wherein the microcomputer is configured to control the switching electric circuit to stop the discharge of the electric charge from the power storage to the transceiver based on the transmission/reception by the transmission/reception controller being completed.

3. The thermoelectric generator according to claim 1, wherein the microcomputer is configured to control the switching electric circuit to stop the discharge of the electric charge from the power storage to the transceiver based on a discharge time elapsed from a start of the discharge of the electric charge from the power storage to the transceiver being equal to or longer than a time threshold.

4. The thermoelectric generator according to claim 1, wherein the predetermined voltage is constant.

5. The thermoelectric generator according to claim 1, further comprising a voltage measurement circuit configured to sense the voltage of the power storage, wherein the microcomputer is configured to control the switching electric circuit to stop the discharge of the electric charge to the transceiver before the voltage of the power storage drops to a voltage threshold.

6. The thermoelectric generator according to claim 5, wherein the voltage threshold is greater than zero.

7. The thermoelectric generator according to claim 1, wherein the microcomputer is configured to control the switching electric circuit to stop the discharge of the electric charge from the power storage to the transceiver based on the voltage of the power storage being equal to or lower than a voltage threshold.

8. The thermoelectric generator according to claim 7, wherein the voltage threshold is greater than zero.

9. The thermoelectric generator according to claim 7, further comprising a voltage measurement circuit configured to sense the voltage of the power storage.

10. The thermoelectric generator according to claim 7, wherein the voltage threshold is constant and greater than zero.

11. The thermoelectric generator according to claim 10, wherein the predetermined voltage is constant and greater than the voltage threshold.

* * * * *